US010168401B2

(12) United States Patent
Hou et al.

(10) Patent No.: US 10,168,401 B2
(45) Date of Patent: Jan. 1, 2019

(54) RADIO-FREQUENCY COIL ASSEMBLY FOR MAGNETIC RESONANCE IMAGING

(71) Applicant: SHANGHAI UNITED IMAGING HEALTHCARE CO., LTD., Shanghai (CN)

(72) Inventors: Xiangming Hou, Shanghai (CN); Li Zhang, Shanghai (CN); Chao Zhi, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 235 days.

(21) Appl. No.: 15/168,192

(22) Filed: May 30, 2016

(65) Prior Publication Data

US 2017/0082705 A1 Mar. 23, 2017

(30) Foreign Application Priority Data

Sep. 17, 2015 (CN) .......................... 2015 1 0594716

(51) Int. Cl.
*G01V 3/00* (2006.01)
*G01R 33/36* (2006.01)
*G01R 33/34* (2006.01)
*G01R 33/3415* (2006.01)

(52) U.S. Cl.
CPC ....... *G01R 33/36* (2013.01); *G01R 33/34007* (2013.01); *G01R 33/3415* (2013.01)

(58) Field of Classification Search
CPC ................ H01R 13/6592; H01R 9/037; H01R 13/6474; H01R 13/6593; H01R 2107/00; H01R 24/64; H01R 9/032; H01R 13/514; H01R 43/0263; H01R 43/28; H01R 4/027; H01R 9/035; H01R 11/09; H01R 13/5816; H01R 9/2416; H01R 9/034; H01R 9/0521; A61K 41/0004; A61N 2/02; A61N 5/1048; A61N 1/056; A61N 1/3752; G01V 3/20; G06F 11/079; G06F 11/221; G01R 31/023; G01R 31/02
See application file for complete search history.

(56) References Cited

U.S. PATENT DOCUMENTS

| 4,682,125 A * | 7/1987 | Harrison ............ G01R 33/3628 324/318 |
| 5,084,594 A * | 1/1992 | Cady ...................... H01B 7/083 174/117 F |
| 6,998,843 B2 * | 2/2006 | Okamoto ............ G01R 33/3415 324/307 |

(Continued)

FOREIGN PATENT DOCUMENTS

WO WO 01/86280 A1 * 11/2004 ............. G01N 29/00

*Primary Examiner* — Vinh Nguyen
(74) *Attorney, Agent, or Firm* — Metis IP LLC

(57) ABSTRACT

Provided herein is a radio frequency (RF) coil assembly. The RF coil assembly includes one or more coil elements arranged on a shell, a cable connector electrically connected to the coil elements, the cable connector including a number of inner wires enclosed with an outer insulative jacket, and the cable having a first end connect to a connector and a second end rotatably connected with the shell, and the inner wires exposed outwardly of the outer insulative jacket of the second end of the cable and electrically connected to the coil elements.

19 Claims, 8 Drawing Sheets

(56) References Cited

U.S. PATENT DOCUMENTS

| | | | |
|---|---|---|---|
| 7,046,008 B2* | 5/2006 | Okamoto | G01R 33/3415 |
| | | | 324/318 |
| 2005/0242812 A1 | 11/2005 | Okamoto et al. | |
| 2009/0167287 A1* | 7/2009 | Van Meijl | G01R 31/023 |
| | | | 324/66 |

* cited by examiner

RADIO-FREQUENCY COIL ASSEMBLY FOR MAGNETIC RESONANCE IMAGING

CROSS REFERENCE TO RELATED APPLICATIONS

This application claims priority of Chinese Patent Application No. 201510594716.3 filed on Sep. 17, 2015, which is hereby incorporated by reference in its entirety.

TECHNICAL FIELD

The present disclosure generally relates to magnetic resonance imaging (MRI), and more particularly, to a radio frequency (RF) coil for MRI.

BACKGROUND

Magnetic Resonance Imaging (MRI), also called Spin imaging, Nuclear Magnetic resonance imaging (NMRI) is a widely used medical technique, which is a great progress after Computed Tomography (CT). Since 1980's, MRI has been developing very fast and utilizing in different fields. Its basic principle is that by disposing a body in a special magnetic field, and the body's hydrogen atoms can be polarized; then radio frequency pulses are used for stimulating the hydrogen nuclei of the body, and the hydrogen nuclei absorb RF energy and start resonating. After stopping the RF pulse, hydrogen nuclei emit a specific radio frequency signal, which is detected by RF coils (RF antennas), the specific radio frequency signal is transmitted to a computer and an MR imaging of region of interest (ROI) of the body is reconstructed.

MRI can provide a lot of information of ROI of the body, more than other medical imaging. It is very easy to get anatomy imaging along cross section/sagittal section/coronal section of ROI of the body. Furthermore, the MRI art has other advantages, it does not produce ionizing radiation for the body, and therefore there is no adverse effects on the body, so the MRI art is used widely in medical field.

The RF coil is an important component of the magnetic resonance imaging system, and the RF coil can not only generate RF pulses for exciting hydrogen nuclei of the body, but also receive magnetic resonance signals of the body. The magnetic resonance signals can be processed later to reconstruct anatomy imaging, which may be 2D/3D imaging. In order to acquire better MR signal and improve signal noise ratio (SNR) of the imaging, a local coil (RF coil) is widely used. Commonly, the local coil is specifically designed for corresponding part of the body, such as head coil, wrist coil, spine coil, etc.

The RF coil is connected to a computer of MR system via transmitting lines. In consideration of convenience for operating this tool, there is only one cable with several inner wires connecting to coil elements of the RF coil. However, as a number of transmission channels increases, the outer diameter of the cable also increases, so the cable becomes somewhat rigid. In addition, the cable is fixed to the RF coil, and there is less movement space between joining portion therebetween, and it is not facilitate to use this kind of RF coil.

SUMMARY

In a first aspect of the present disclosure, a RF coil in magnetic resonance imaging is provided. A RF coil assembly comprises: one or more coil elements arranged on a shell, a cable connector electrically connected to the coil elements, the cable connector including a number of inner wires enclosed with an outer insulative jacket, and the cable having a first end connect to a connector and a second end rotatably connected with the shell, and the inner wires exposed outwardly of the outer insulative jacket of the second end of the cable and electrically connected to the coil elements.

In some embodiments, the second end of the cable is pivotally coupled to the shell.

In some embodiments, the second end of the cable is connected to the shell by a rotational device.

In some embodiments, the rotational device has a rotating unit secured to the second end of the cable.

In some embodiments, the rotating unit includes an upper half and a lower half assembled together along up-to-down direction.

In some embodiments, the upper half has a first cylindrical portion protruding upwardly and a first positioning portion projecting laterally, the lower half has a second cylindrical portion protruding downwardly and a second positioning portion projecting laterally.

In some embodiments, the second end of the cable is sandwiched by the first positioning portion and the second positioning portion.

In some embodiments, the rotational device has a holding member to support the rotating unit, and the rotating unit is capable of rotating relative to the holding member.

In some embodiments, the holding member is coupled to the shell.

In a second aspect of the present disclosure, an RF coil assembly is provided. The RF coil comprises an RF coil and a cable connector, the RF coil having a shell enclosing an interior room 105 for receiving a scanned subject, and plurality of coil elements secured to the shell and disposed outside of the interior room 105, and the cable connector electrically connected to the coil elements, and the cable connector having a cable and a connector connected to a first end of the cable, and the cable having a second end mechanically connected with the shell via a rotational device.

In some embodiments, the cable connector includes a cable connector is disposed in cantilevered manner.

In some embodiments, the cable connector has a mating port facing downwardly.

In some embodiments, the interior room 105 of the shell has a front opening, and the mating port is disposed adjacent to a rear end of the shell.

In some embodiments, the cover has a recess portion at a lateral lower side, and the cable connector is received therein.

In a third aspect of the present disclosure, a RF coil assembly is provided. The RF coil assembly comprises one or more coil elements arranged on a shell, a cable connector electrically connected to the coil elements, the cable connector including a number of inner wires enclosed with an outer insulative jacket, and the cable having a first end connect to a connector and the inner wires exposed outwardly of the outer insulative jacket of the second end of the cable and electrically connected to the coil elements, and the connector capable of swing from a first position to a second position.

In some embodiments, the second end of the cable is moveable relative to the shell.

In some embodiments, a rotational device is pivotally engaged with the second end of the cable and coupled to the cover.

In some embodiments, the rotatable device includes a rotating unit, a holding member and a fame, and the rotating unit is secured to the second end of the cable and is capable of rotating within the holding member, and the holding member is mounted to the frame which is fixed to the shell.

In some embodiments, the holding member has a main body and a supporting panel laterally extending therefrom, and the main body defines a receiving space adapting the rotating unit and the inner wires are fixed to the supporting panel.

In some embodiments, the inner wires are configured to be serpentine type.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

It will be understood that when a module or unit is referred to as being "on", "connected to" or "coupled to" another module or unit, it may be directly on, connected or coupled to the other module or unit or intervening module or unit may be present. In contrast, when a module or unit is referred to as being "directly on," "directly connected to" or "directly coupled to" another module or unit, there may be no intervening module or unit present. As used herein, the term "and/or" includes any and all combinations of one or more of the associated listed items.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The present disclosure generally relates to a RF coil used in magnetic resonance imaging. Please referring to FIGS. 1-8, the RF coil assembly 100 in accordance with the present disclosure comprises a RF coil 10 and a cable connector 20 physically and electrically connected to the RF coil 10. The RF coil may be head coil, spine coil, wrist coil, etc.

Figure 1:
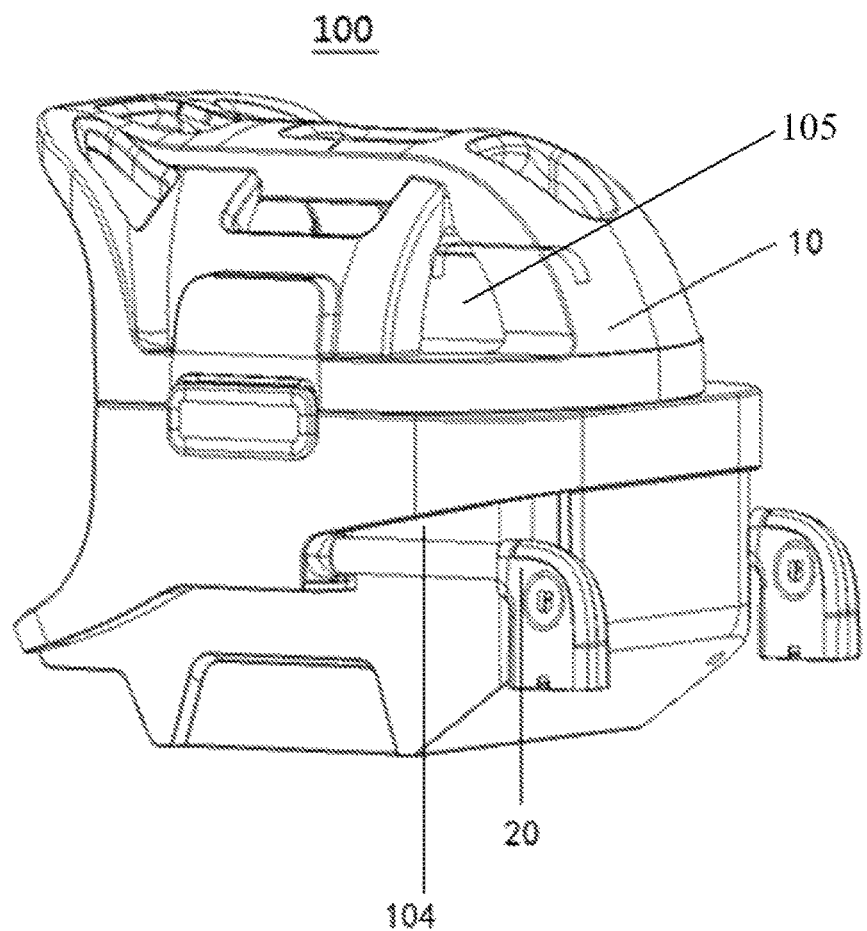
FIG. 1 is an assembled, perspective view of a RF coil assembly according to a first embodiment of the present disclosure.
Figure 2:
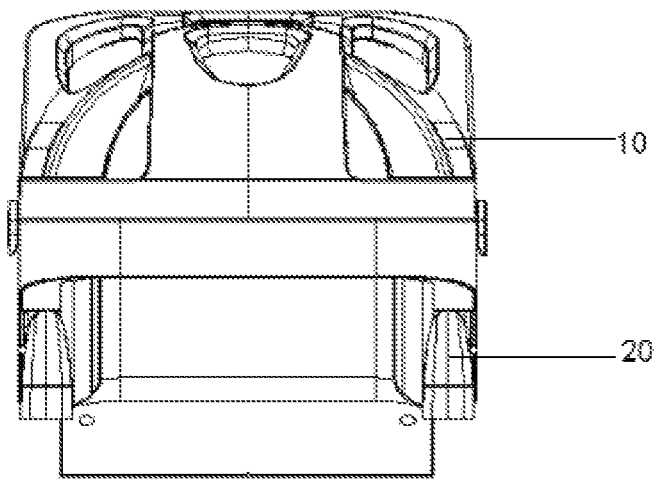
FIG. 2 is a back elevational view of the RF coil assembly shown in FIG. 1.
Figure 3:
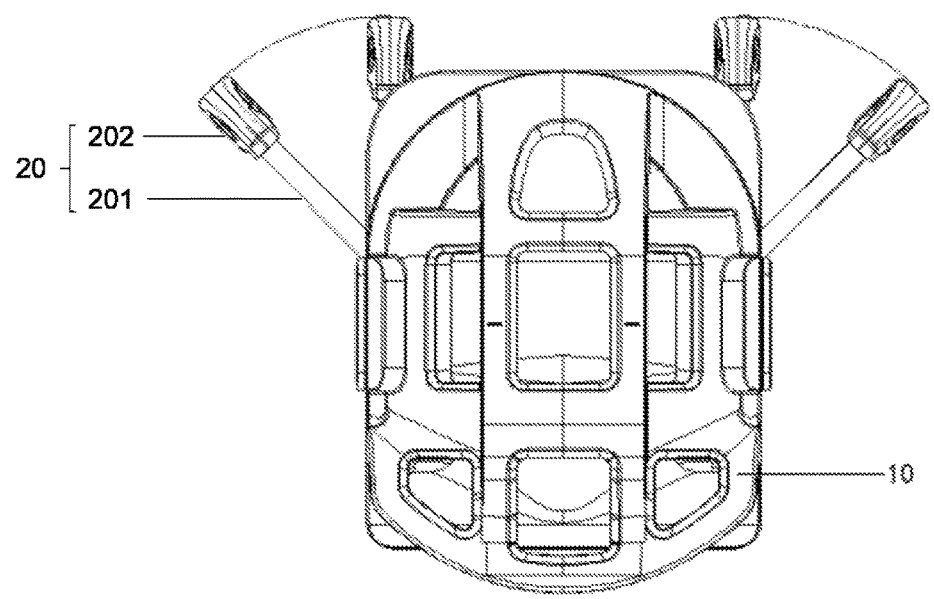
FIG. 3 is a schematic diagram illustrating a cable connector rotating/swing relative to a shell of the RF coil assembly.
Figure 4:
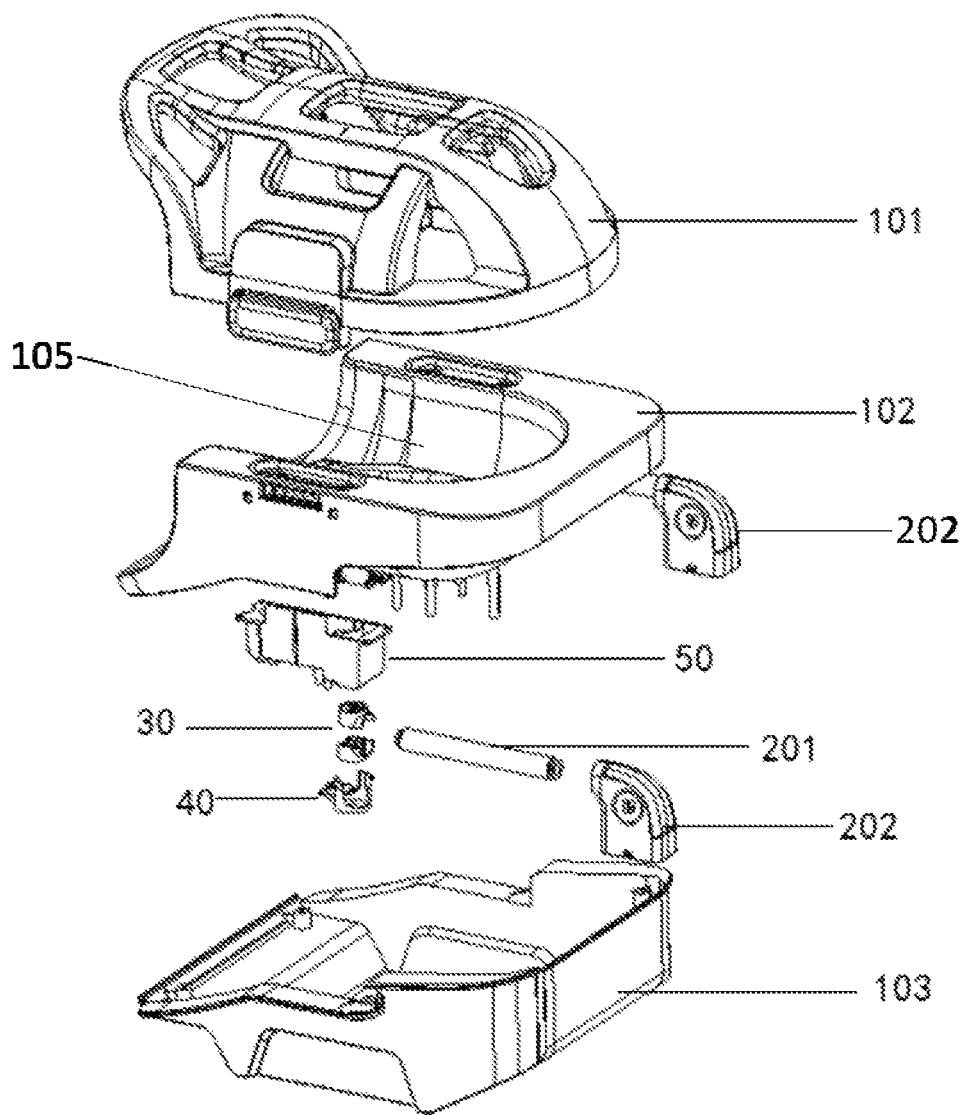
FIG. 4 is an exploded perspective view of the RF coil assembly shown in FIG. 1.
Figure 5:
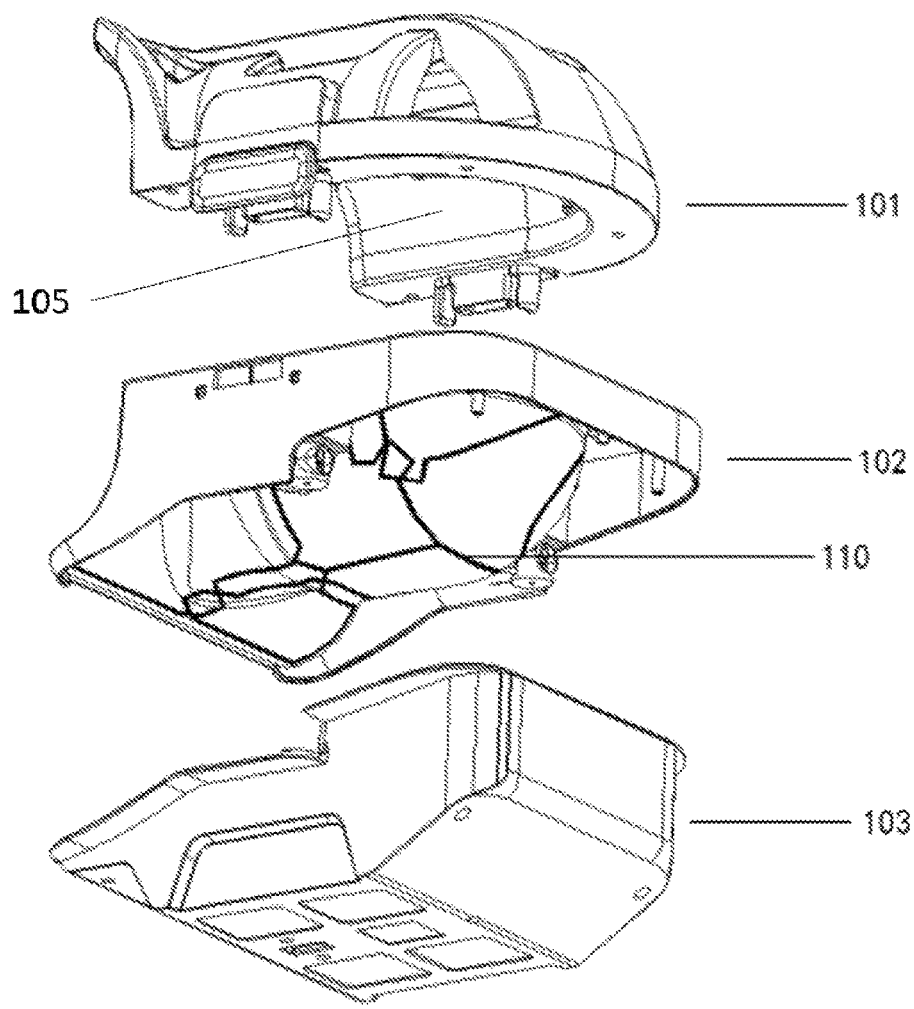
FIG. 5 is an exploded perspective view of the shell of the RF coil assembly.
Figure 6:
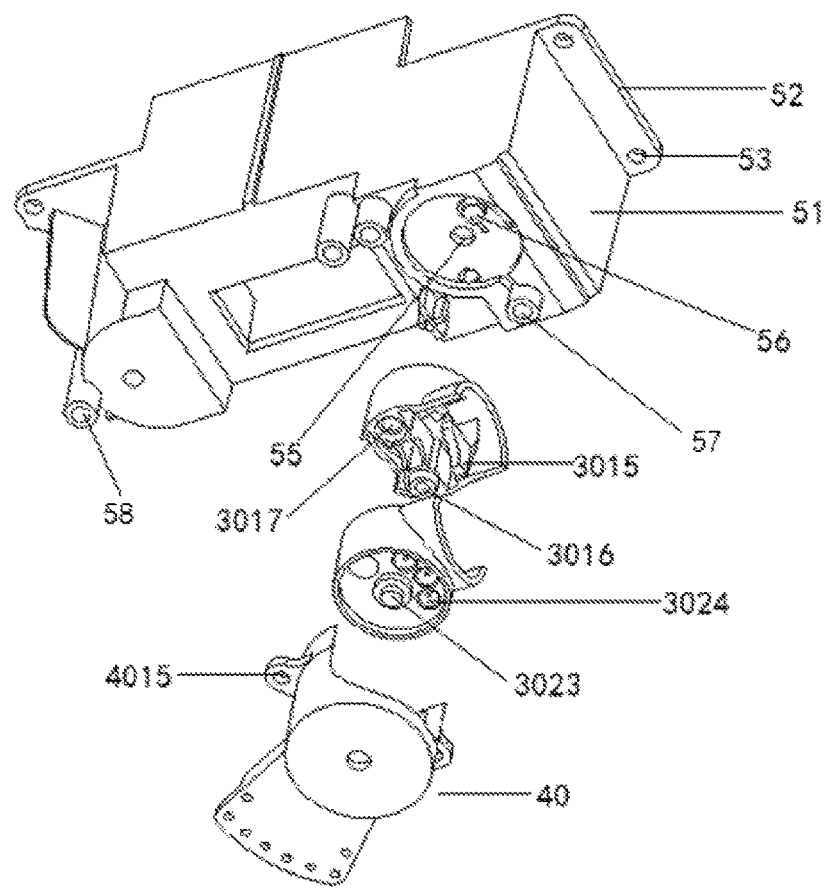
FIG. 6 is an exploded perspective view of a rotational device of the RF coil assembly.
Figure 7:
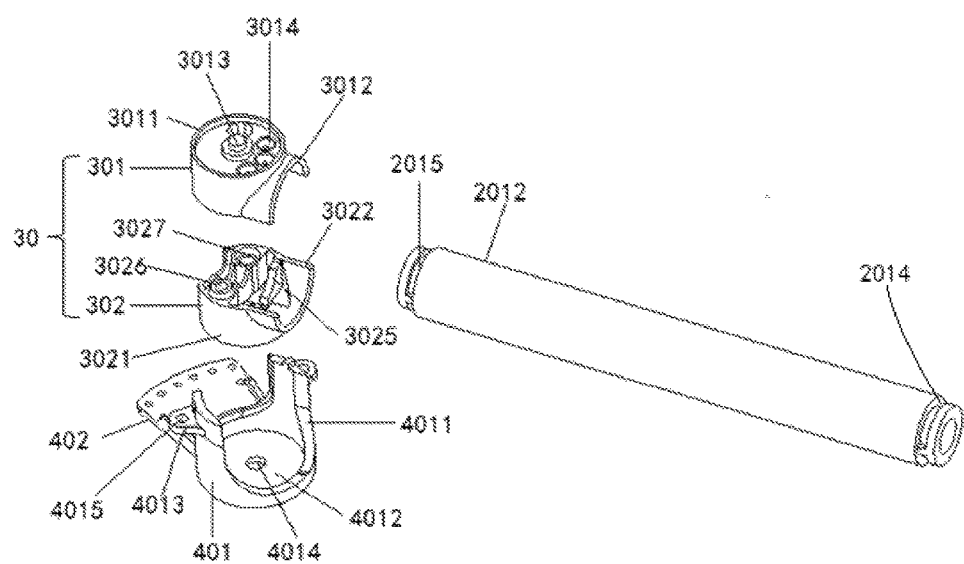
FIG. 7 is an exploded perspective view of a rotating unit and a cable of the RF coil assembly.
Figure 8:
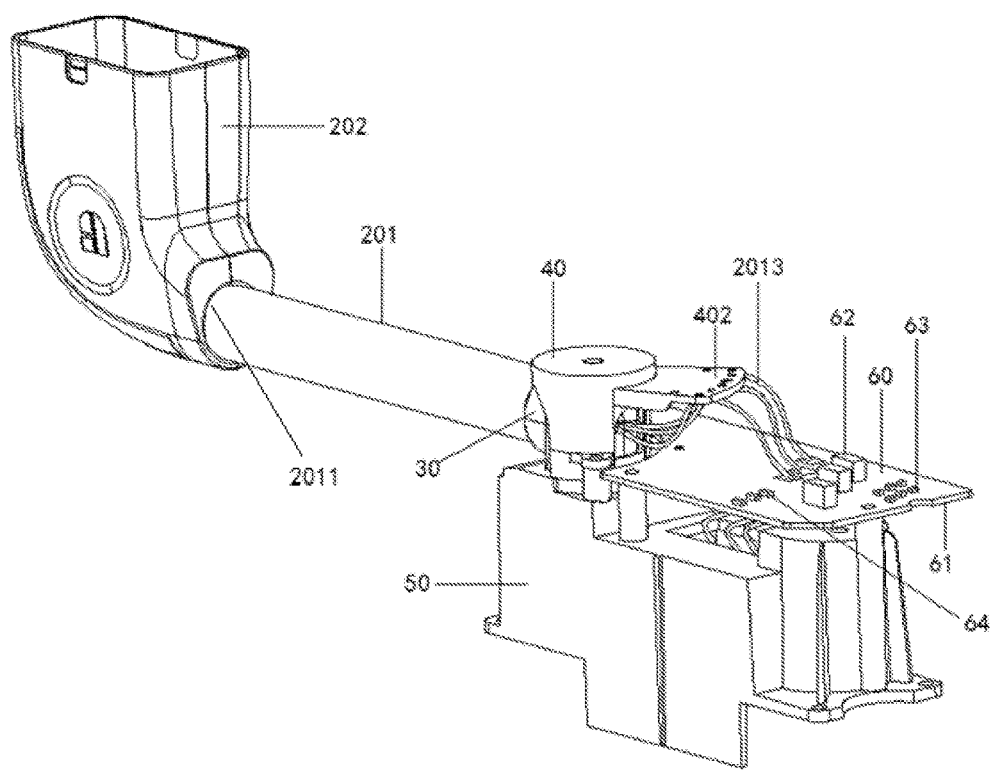
FIG. 8 is an assembled, perspective view of the rotational device and a cable connector of the RF coil assembly.

The RF coil 10 includes a shell for supporting a number of coil elements 110. The shell may be made of non-magnetic material, e.g., insulative material or others. The shell has an upper housing 101 and a lower housing, and the lower housing has a lower substrate body 102 and a lower outer shielding 103. As shown in FIGS. 4 and 5, the shell encloses an interior room 105 for receiving a scanned subject. The coil elements 110 may be secured to the shell and disposed outside of the interior room 105. Some of the coil elements 110 disposed between the lower substrate body 102 and the lower outer shielding 103. The coil elements 110 are arranged along outer contour of the lower substrate body 102. Also, there are some coil elements 110 arranged on the upper half by similar manner. The coil elements 110 are made of copper foil, copper conductor and flat flexible substrate. In alternative embodiment, the upper housing and the lower housing may be a unitary structure, and the lower housing may be one piece type. The lower substrate body 102 has a recess portion 104 at lateral bottom side thereof, the recess portion 104 is adapted for receiving the cable connector 20.

It should be noted that the above description of the shell and coil elements is merely provided for the purposes of illustration, and not intended to limit the scope of the present disclosure. For persons having ordinary skills in the art, multiple variations and modifications may be made under the teaching of the present invention. However, those variations and modifications do not depart from the scope of the present disclosure.

The cable connector 20 includes cable 201 and a connector 202. The cable 201 has a first end 2011 and a second end 2012 opposite to each other. The first end 2011 is connected to the connector 202. The cable 201 includes a number of inner wires 2013 and an insulative jacket 2014 enclosing the inner wires 2013. A certain length of the insulative jacket of the second end is stripped off, with part of the corresponding inner wires 2013 exposing outward and further electrically connected to the coil elements 110. The second end 2012 is joined to shell of the RF coil 10 and capable of rotating to the RF coil 10. The cable 201 is pivotally engaged with the RF coil 10 via a rotatable device, which is mounted to the lower half of the shell. Therefore the cable connector 20 is capable of swinging between 0° and 90° in a horizontal plane or a vertical plane. Thus, the outlet of the cable is multi-directional, flexible, and is friendly for users. In addition, the cable connector 20 is retracting to the recess portion 104, when the RF coil 10 is not working. The length of the cable 201 is 10 cm-30 cm, and the diameter of the cable is 10 mm-30 mm.

It should be noted that the above description of the RF coil 10, the cable connector 20 and their relationship is merely provided for the purposes of illustration, and not intended to limit the scope of the present disclosure. For persons having ordinary skills in the art, multiple variations and modifications may be made under the teaching of the present invention. However, those variations and modifications do not depart from the scope of the present disclosure.

The rotatable device includes a rotating unit 30, a holding member 40 and a fame 50. The rotating unit 30 is held by the holding member 40, which is further assembled to the frame 50. The frame 50 is fixed to the shell of the RF coil 10.

The rotating unit 30 is mounted into the holding member 40 and capable of rotating with regarding to the holding member 40. The rotating unit 30 includes an upper half 301 and a lower half 302 assembled together along up-to-down direction. The upper half 301 has a first cylindrical portion 3011 protruding upwardly and a first positioning portion 3012 projecting laterally. The lower half 302 has a second cylindrical portion 3021 protruding downwardly and a second positioning portion 3022 projecting laterally. There is a first central shaft 3013 projecting upwardly at a center of the first cylindrical portion 3011, with three concaves 3014 disposed around the first central shaft 3013. The first positioning portion 3012 is half-shaped tube, with a first retainer 3015 located therein. In addition, there are a first positioning rib 3016 disposed in an interior of the first cylindrical portion 3011, and a first positioning hole 3017 disposed at lateral side of the first positioning rib 3016. There is a second central shaft 3023 projecting downwardly at a center of the second cylindrical portion 3021, with three concaves 3024 disposed around the second central shaft 3023. The second positioning portion 3022 is half-shaped tube, with a second retainer 3025 therein. In addition, there are a second positioning rib 3026 disposed in an interior of the second cylindrical portion 3021, and a second positioning hole 3027 disposed at lateral side of the second positioning rib 3026. There is a retaining slot 2015 located in the second end 2012, when the rotating unit 30 is mounted to the second end 2012, the upper half 301 and the lower half 302 corporately sandwich the second end 2012 therebetween, with the first retainer 3015 and the second retainer 3025 inserting into the slot 2015, and the first positioning rib 3016 engaging with the second positioning hole 3027, and the first positioning hole 3017 engaging with the second positioning rib 3026. Therefore, the second end 2012 is securely fixed to the rotating unit 30.

It should be noted that the above description of the rotating unit 30 is merely provided for the purposes of illustration, and not intended to limit the scope of the present disclosure. For persons having ordinary skills in the art, multiple variations and modifications may be made under the teaching of the present invention. However, those variations and modifications do not depart from the scope of the present disclosure.

The holding member (protecting member) 40 has main body 401 and a supporting panel 402 laterally extending therefrom. The main body 401 has a bottom side 4012 and circumferential side wall 4011 together defining a cylindrical shaped receiving space for adapting and protecting the rotating unit 30. There are a front cutout and a back cutout in the side wall 4011 for the cable 201 and wires 2013 passing therethrough. In addition, there are two wing portions 4013 extending from the side wall 4011 along the left direction and the right direction. Furthermore, there is a central hole 4014 located in the bottom side 4012.

It should be noted that the above description of the holding member 40 is merely provided for the purposes of illustration, and not intended to limit the scope of the present disclosure. For persons having ordinary skills in the art, multiple variations and modifications may be made under the teaching of the present invention. However, those variations and modifications do not depart from the scope of the present disclosure.

The frame 50 has a cubic shaped body 51, with a several mounting panels 52 being arranged at upper edges thereof and extending horizontally therefrom. There are through holes 53 in the mounting panels 52 for screws passing through and fixing the frame 50 to the lower substrate body 102 of the shell. There is a circular shaped groove 54 located in a bottom side of the frame 50, with a central positioning concave 55 defined in circular shaped groove 54, and an protrusion 56 arranged nearby the central positioning concave 55. The protrusion 56 is disposed at a cantilevered manner, so as to increase its elastic character. Furthermore, there are a pair of positioning posts 57 disposed outside of the circular shaped groove 54, with each positioning post 57 having a screw hole. There is a supporting post 58 formed on the bottom side of the frame 50, with corresponding screw hole defined therein.

It should be noted that the above description of the frame 50 is merely provided for the purposes of illustration, and not intended to limit the scope of the present disclosure. For persons having ordinary skills in the art, multiple variations and modifications may be made under the teaching of the present invention. However, those variations and modifications do not depart from the scope of the present disclosure.

The rotating unit 30, a holding member 40 and the frame 50 are assembled together by following way: firstly, the upper half 301 and the lower half 302 are mounted to the second end 2012 of the cable 201; secondly, the upper half 301 is mounted to the circular shaped groove 54, with the first central shaft 3013 inserting into the central positioning concave 55, and the protrusion 56 stopping by one of the three concaves 3014 to constrain the rotating unit 30 at a certain position; thirdly, the holding member 40 is mounted to the frame 50, with the rotating unit 30 restrained therebetween, and the cable 201 extending outwardly from one cutout of the holding member 40, and the inner wires 2013 extending outwardly from another cutout of the holding member 40, the second central shaft 3023 inserting into the central hole 4014 located in the bottom side 4012. The holding member 40 is fixed to the frame 50, by screws assembled into holes 4015 and positioning posts 57. The rotating unit 30 is restrained in a space defined by the holding member 40 and the frame 50, and the rotating unit 30 is capable of swinging or rotating in a certain range of an angle, i.e. between 0° and 90°. The frame 50 is secured to the lower substrate body 102 by applying screws into through holes 53 of the mounting panels 52 and corresponding screw holes in the substrate body 102.

The RF coil assembly further includes a printed circuit board assembly 60, which is fastened to supporting post 58. The printed circuit board assembly has a PCB 61, RF traps 62, resistors 63, capacitors 64, etc. The inner wires 2013 firstly connecting with the RF traps 62, and then electrically connecting with the coil elements 110. The inner wires 2013 adjacent to the second end 2012 of the cable 201 are scattered and attached to the supporting panel 402, so the inner wires 2013 are loose and flexible, being configured to serpentine type, may be "S" shape. So when the cable 201 is rotating, and the inner wires 2013 are swinging, there is no much twisting force exerting to the inner wires 2013, therefore the second end 2012 gets very good strain relief. The supporting member 402 is fan shaped, with several holes located in a front end thereof, fastening band/strap or glue may be employed to fix the inner wires 2013 to the supporting panel 402. The wires 2013 are arranged into one layer. In alternative embodiment, the second end 2012 of the cable 201 is also mounted to the supporting member 402. In other alternative embodiment, the inner wires 2013 adjacent to the rotating unit 30 are not exposed outside, instead, there is a transition section of the second end 2012 is disposed adjacent to and outward of the rotating unit 30 about 2-5 cm, and the insulative jacket of this transition section is not removed off, and the transition section is further coupled with an RF trap, which is further connected to the printed circuit board assembly 60 or the frame 50. The transition section is bendable and capable of swinging with the rotating unit 30. Alternatively, an end of transition section is directly secured by a cable clipping element, so as to restrict the transition section moving freely and ensure connection of the wires and electronic elements and the coil element. Preferably, a length of the transition section (between clipping element and the rotating unit 30) is more than 2 cm, or more than 3 cm, or more than 4 cm, or more than 5 cm.

It should be noted that the above description is merely provided for the purposes of illustration, and not intended to limit the scope of the present disclosure. For persons having ordinary skills in the art, multiple variations and modifications may be made under the teachings of the present disclosure. For example, the original size of k-space, the reduction factor, the amount of the acquired echoes and the amount of data points acquired from an echo may be changed or selected according to variations or modifications without departing from the scope of the present disclosure.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

What is claimed is:

1. A radio frequency (RF) coil assembly, comprising: one or more coil elements arranged on a shell, a cable connector electrically connected to the coil elements, and a rotational device, the cable connector including a cable and a connector, the cable having a number of inner wires enclosed with an outer insulative jacket, and the cable having a first end connected to the connector and a second end connected to the shell via the rotational device.

2. The RF coil assembly of claim 1, wherein the second end of the cable is pivotally coupled to of the shell via the rotational device.

3. The RF coil assembly of claim 1, wherein the rotational device has a rotating unit secured to the second end of the cable.

4. The RF coil assembly of claim 3, wherein the rotating unit includes an upper half and a lower half assembled together along an up-to-down direction.

5. The RF coil assembly of claim 4, wherein the upper half has a first cylindrical portion protruding upwardly and a first positioning portion projecting laterally, the lower half has a second cylindrical portion protruding downwardly and a second positioning portion projecting laterally.

6. The RF coil assembly of claim 5, wherein the second end of the cable is sandwiched by the first positioning portion and the second positioning portion.

7. The RF coil assembly of claim 3, wherein the rotational device has a holding member to support the rotating unit, and the rotating unit is capable of rotating relative to the holding member.

8. The RF coil assembly of claim 7, wherein the holding member is coupled to the shell.

9. A radio frequency (RF) coil assembly, comprising an RF coil and a cable connector, the RF coil having a shell enclosing an interior room for receiving a scanned subject, and a plurality of coil elements secured to the shell and disposed outside of the interior room, and the cable connector electrically connected to the coil elements, and the cable connector having a cable and a connector, wherein the cable has two opposite ends, a first end of the cable connected to the connector, and a second end of the cable mechanically connected with the shell via a rotational device.

10. The RF coil assembly of claim 9, wherein the cable connector includes a cable connector disposed in cantilevered manner.

11. The RF coil assembly of claim 9, wherein the interior room of the shell has a front opening, and the connector is disposed adjacent to a rear end of the shell.

12. The RF coil assembly of claim 9, wherein the shell has a recess portion at a lateral lower side, and the cable connector is received therein.

13. A radio frequency (RF) coil assembly, comprising: one or more coil elements arranged on a shell, a cable connector electrically connected to the coil elements, the cable connector including a cable and a connector, the cable having a number of inner wires enclosed with an outer insulative jacket, and the cable having a first end connected to the connector and the inner wires exposed outwardly of the outer insulative jacket of a second end of the cable and electrically connected to the coil elements, and the diameter of the cable is at least 10 millimeters so that the cable connector is capable of rigidly swinging from a first position to a second position; and
    a rotational device is pivotally engaged with the second end of the cable and coupled to the shell.

14. The RF coil assembly of claim 13, wherein the second end of the cable is moveable relative to the shell.

15. The RF coil assembly of claim 13, wherein the rotational device includes a rotating unit, a holding member and a frame, and the rotating unit is secured to the second end of the cable and is capable of rotating within the holding member, and the holding member is mounted to the frame which is fixed to the shell.

16. The RF coil assembly of claim 15, wherein the holding member has a main body and a supporting panel laterally extending therefrom, and the main body defines a receiving space adapting the rotating unit and the inner wires are fixed to the supporting panel.

17. The RF coil assembly of claim 15, wherein the holding member supports the rotating unit, the rotating unit is capable of rotating relative to the holding member, and the number of wires connect a printed circular board assembly disposed aside of the rotational device.

18. The RF coil assembly of claim 13, wherein the inner wires are configured to be of a serpentine type.

19. The RF coil assembly of claim 13, wherein the length of the cable is 10 cm-30 cm, and the diameter of the cable is 10 mm-30 mm.

* * * * *